US008018037B2

(12) United States Patent
Chen (10) Patent No.: US 8,018,037 B2
(45) Date of Patent: Sep. 13, 2011

(54) SEMICONDUCTOR CHIP PACKAGE

(75) Inventor: Nan-Jang Chen, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 190 days.

(21) Appl. No.: 12/424,572

(22) Filed: Apr. 16, 2009

(65) Prior Publication Data

US 2010/0264533 A1  Oct. 21, 2010

(51) Int. Cl.
*H01L 23/495* (2006.01)
*H01L 21/00* (2006.01)

(52) U.S. Cl. . 257/676; 257/690; 257/782; 257/E23.031; 257/E23.043; 257/E23.052; 438/123

(58) Field of Classification Search ............... None
See application file for complete search history.

(56) References Cited

U.S. PATENT DOCUMENTS

| | | | | |
|---|---|---|---|---|
| 4,975,761 A * | 12/1990 | Chu | | 257/686 |
| 5,327,008 A | 7/1994 | Djennas et al. | | |
| 5,508,556 A * | 4/1996 | Lin | | 257/691 |
| 5,854,512 A * | 12/1998 | Manteghi | | 257/735 |
| 5,920,116 A | 7/1999 | Umehara | | |
| 6,326,678 B1 | 12/2001 | Karnezos et al. | | |
| 6,552,417 B2 | 4/2003 | Combs | | |
| 7,173,341 B2 | 2/2007 | Ho et al. | | |
| 7,833,840 B2 * | 11/2010 | Ahn et al. | | 438/123 |
| 2003/0214023 A1 | 11/2003 | Uchida | | |
| 2006/0170992 A1 | 8/2006 | Wei | | |
| 2007/0018291 A1 * | 1/2007 | Huang et al. | | 257/676 |
| 2008/0303124 A1 * | 12/2008 | Khan et al. | | 257/675 |

FOREIGN PATENT DOCUMENTS

| | | |
|---|---|---|
| CN | 2585407 | 11/2003 |
| JP | 61014731 | 1/1986 |
| JP | 04245466 | 9/1992 |
| JP | 07297348 | 11/1995 |
| JP | 2000058739 | 2/2000 |

OTHER PUBLICATIONS

English language translation of abstract of JP 61014731 (published Jan. 22, 1986).
English language translation of abstract of JP 04245466 (published Sep. 2, 1992).
English language translation of abstract of JP 07297348 (published Nov. 10, 1995).
English language translation of abstract of JP 2000058739 (published Feb. 25, 2000).
English language translation of abstract of CN 2585407 (published Nov. 5, 2003).
Chen; Non-Final Office Action mailed Jan. 11, 2011 for U.S. Appl. No. 12/889,662, filed Sep. 24, 2010.

* cited by examiner

*Primary Examiner* — Alonzo Chambliss
(74) *Attorney, Agent, or Firm* — Thomas|Kayden (57) ABSTRACT

A semiconductor chip package is provided. The semiconductor chip package includes a lead frame having a chip carrier. A semiconductor chip is mounted on the chip carrier, having a plurality of bonding pads thereon. A package substrate has a cavity therein to accommodate the chip carrier and the semiconductor chip, wherein at least one of the bonding pads of the semiconductor chip is electrically coupled to the package substrate.

22 Claims, 10 Drawing Sheets

SEMICONDUCTOR CHIP PACKAGE

BACKGROUND OF THE INVENTION

1. Field of the Invention

The present invention relates to a semiconductor chip package, and more particularly, relates to a semiconductor chip package with less system electromagnetic interference (EMI) and an increased amount of input/output connections and better package performance.

2. Description of the Related Art

For semiconductor chip package design, an increased amount of input/output connections for multi-functional chips is required. For a conventional lead frame based semiconductor package, however, the amount of leads for input/output connections of a semiconductor chip are limited. To solve the aforementioned problem, a ball grid array (BGA) semiconductor package has been developed to provide a greater amount of input/output connections through solder balls on the bottom of a package substrate of the semiconductor chip package. Requirements for increased input/output connections can be achieved through a finer ball pitch. Compared with the conventional lead frame based semiconductor package, however, the BGA semiconductor package suffers from poorer yields, poorer thermal dissipation efficiency and higher fabricating costs due to the additional electrical connections to the solder balls.

There are some problems in the conventional lead frame base semiconductor package. For example, if the chip with a decreased size is packaged with the fixed sized lead frame, the longer bonding wires for electrical connections between the chip and the lead frame are needed. However, a bonding problem due to the violation of the maximum length of the gold wires occurs. To solve the aforementioned problem, a costly finer pitch lead frame with inner leads, which provides a closer distance between the lead and the chip, is needed. Additionally, if several bonding wires are needed to couple to the same lead of the lead frame with a finer pitch, a short problem would occur.

Also, there are some problems in the conventional BGA semiconductor package coupled to the printed circuit board (PCB). Usually, function of each of the fingers on the PCB are defined, as pin assignments of the pad of the connecting semiconductor chip package completely comply with a required design rule. The traces of the PCB, which are used to couple to the fingers and the pads, may be disposed on the bottom surface of the PCB for routing convenience, thereby forming splits to isolate from the ground plane on the bottom surface of the PCB. However, if a signal trace on the PCB directly passes over the split, an electromagnetic interference (EMI) problem occurs because the undesired magnetic field increases the coupling coefficient between adjacent signal trace.

A novel semiconductor chip package with an increased amount of input/output connections and fabricating cost between the fabricating cost for lead frame and BGA semiconductor packages is desirable.

BRIEF SUMMARY OF INVENTION

A semiconductor chip package is provided. An exemplary embodiment of the semiconductor chip package comprises a lead frame having a chip carrier, a semiconductor chip and a package substrate. The semiconductor chip is mounted on the chip carrier, having a plurality of bonding pads thereon. The package substrate has a cavity therein to accommodate the chip carrier and the semiconductor chip, wherein at least one of the bonding pads of the semiconductor chip is electrically coupled to the package substrate.

Another exemplary embodiment of the semiconductor chip package comprises a lead frame having a chip carrier and leads in different levels, a semiconductor chip and a package substrate. The semiconductor chip is mounted on the chip carrier, having a plurality of bonding pads thereon. The package substrate has a bottom surface align to the chip carrier, wherein at least one of the bonding pads is electrically coupled to the package substrate, and the remaining bonding pads are electrically coupled to the leads, respectively.

An exemplary embodiment of the cavity package substrates not only serves as a heat sink for the semiconductor chip, but also provides an increased amount of input/output connections for the semiconductor chip. Compared with the conventional lead frame based semiconductor package, the cavity package substrates may provide additional electrical connections for the semiconductor chip, and provide an additional area for electrical components to be disposed thereon. Some electrical performances, for example, power circuit inductance or ground circuit inductance, can be improved. Compared with the conventional ball grid array semiconductor package, package substrate may have simple layout. Therefore, fabricating cost can be reduced and yield can be improved. Additionally, the package substrate of the semiconductor chip package may provide additional signal routing paths for signal swapping and signal dividing. The signal traces may directly pass over a solid ground plane without any split because no power translation path occupies the ground plane directly below signal traces. The aforementioned additional signal routing paths may improve electrical performances of a two-layered printed circuit board, for example, good signal quality and less EMI effect, in the high signal frequency region without a costly multi-layered printed circuit board. Also, the bonding distance between the bonding pads and the leads may be reduced by multiple wirebondings provided by the package substrate comprising fingers and the bonding wires, thereby reducing fabrication costs.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 3b to FIG. 3f are enlarged views of portions of FIG. 3a.

FIG. 5b shows a cross section along line A-A' of FIG. 5a.

DETAILED DESCRIPTION OF INVENTION

The following description is of a mode of carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

Figure 1A:
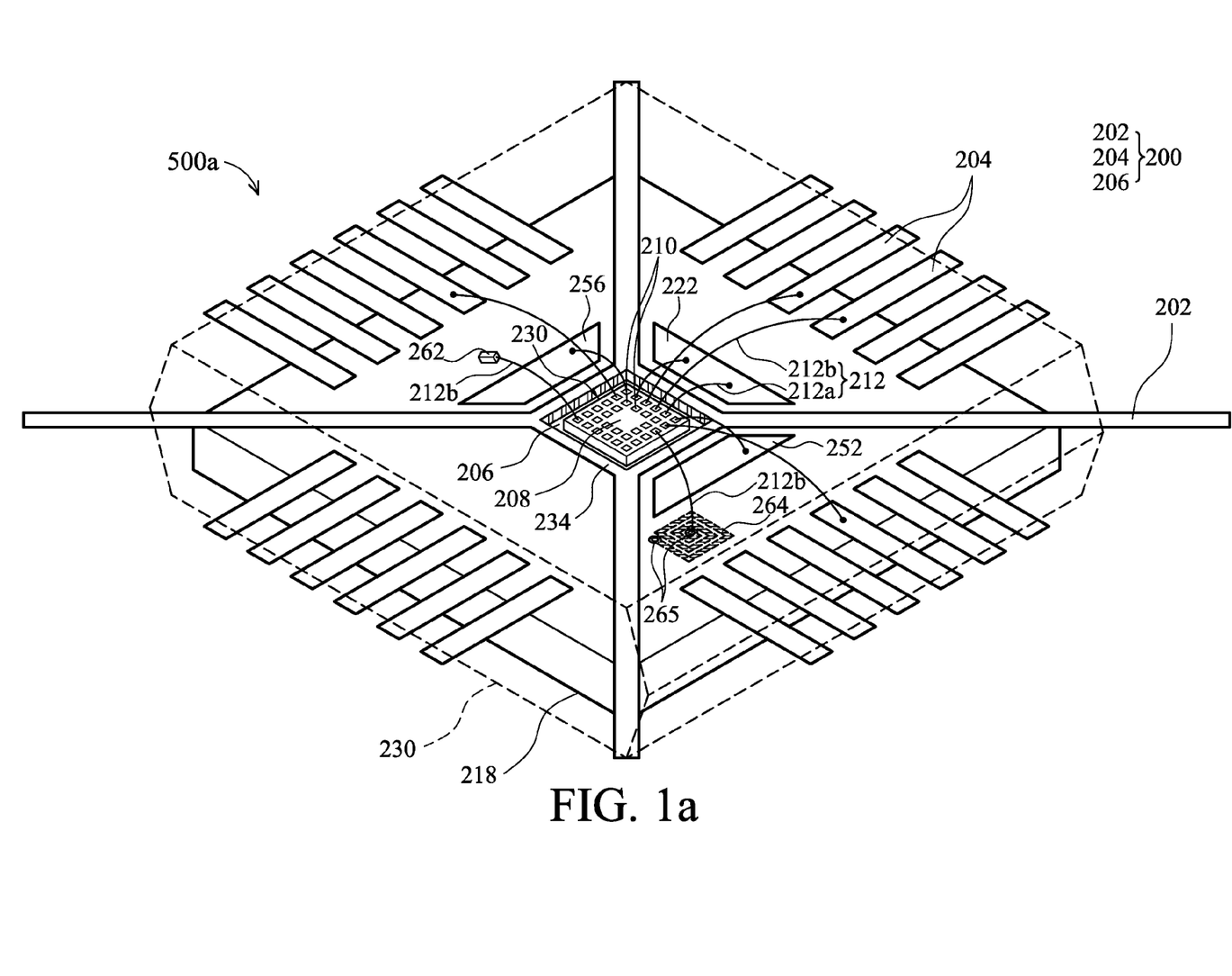
FIG. 1a shows a top view of one exemplary embodiment of a semiconductor chip package of the invention.
Figure 1B:
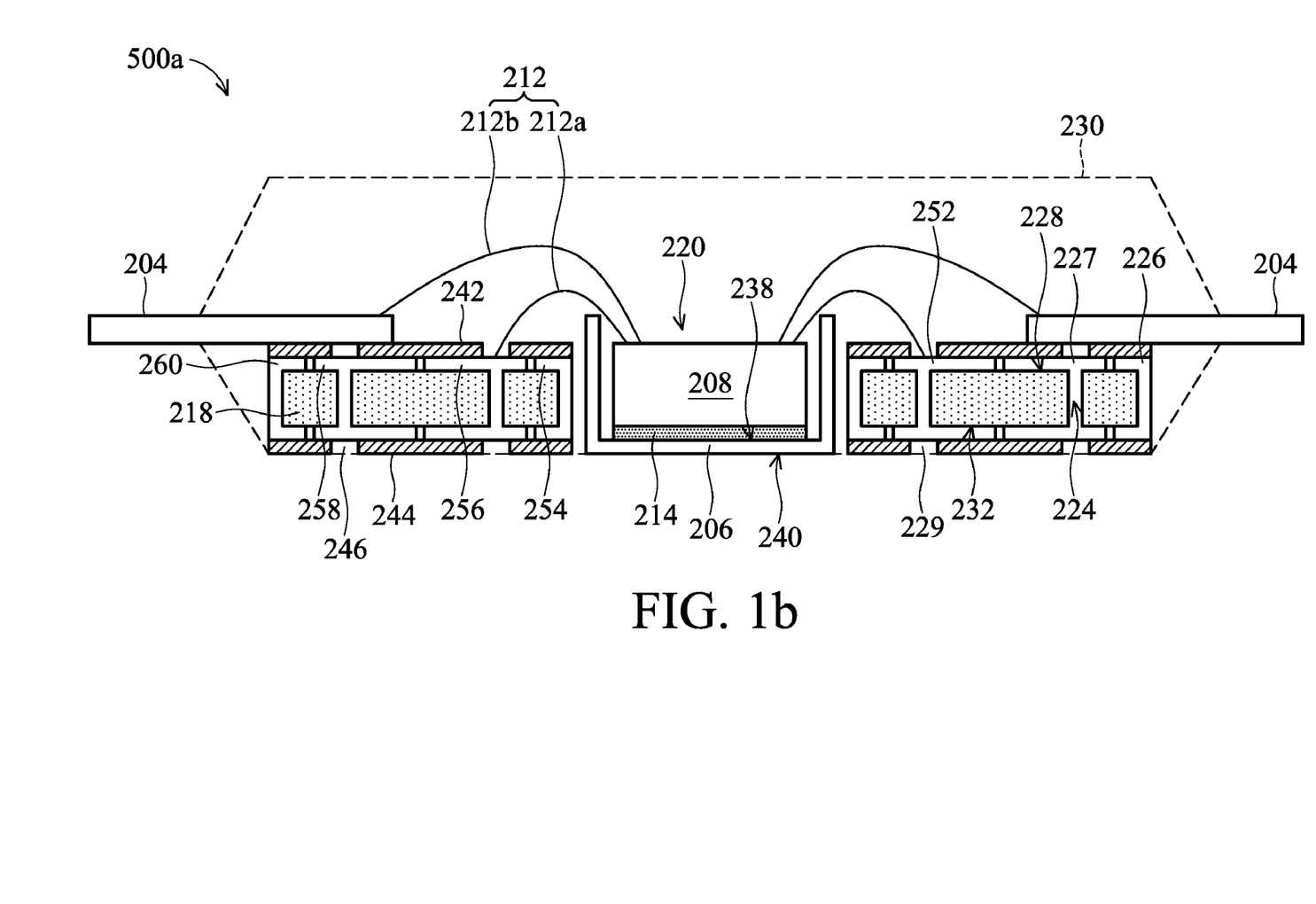
FIG. 1b shows a cross section of one exemplary embodiment of a semiconductor chip package of the invention.
Figure 2:
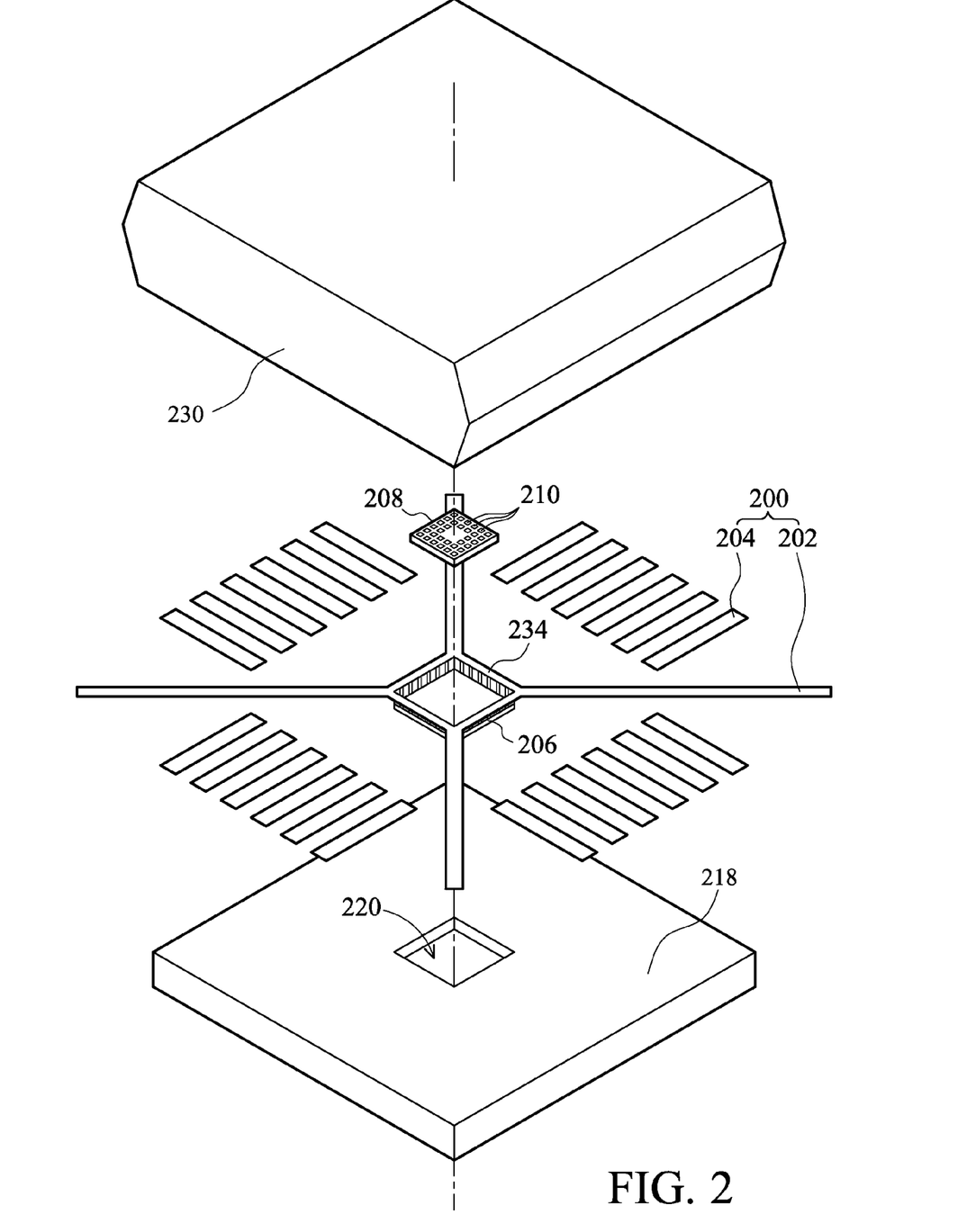
FIG. 2 shows an assembly diagram of an exemplary embodiment of a semiconductor chip package of the invention.

In accordance with an embodiment of the present invention, embodiments of a semiconductor chip package are provided. FIGS. 1a and 1b show one exemplary embodiment of the semiconductor chip package 500a of the invention. FIG. 2 shows an assembly diagram of an exemplary embodiment of the semiconductor chip package 500a. The semiconductor chip package 500a comprises a lead frame 200 comprising a plurality of discrete leads 204, supporting bars 202 and a chip carrier 206. As shown in FIGS. 1a and 1b, the chip carrier 206 and the leads 204 may be in different levels. The chip carrier 206 is disposed in a central portion of lead frame 200, electrically connecting to supporting bars 202. Chip carrier 206 has a top surface 238 and a bottom surface 240.

A semiconductor chip 208 may be mounted on the first surface 238 by an adhesive material 214. The semiconductor chip 208 may have a plurality of bonding pads 210 thereon. The bonding pads 210 include bonding pads 210a to 210f. In one embodiment of the invention, the bonding pads 210 may be positioned to adjacent edges of the semiconductor chip 208 as shown in FIG. 1a.

A package substrate 218 may have a cavity 220 therein to accommodate the chip carrier 206 and the semiconductor chip 208. Therefore, the package substrate 218 may serve as a cavity package substrate 218. In one embodiment of the invention, the cavity package substrate 218 may comprise a ball grid array (BGA) substrate. The cavity package substrate 218 has the solder mask 242 on the top surface 228 for isolation and attaches to the leads 204 and an opposite bottom surface 232. In one embodiment of the invention, the cavity 220 may be formed through the cavity package substrate 218 as shown in FIG. 1b, thereby the bottom surface 240 of the chip carrier 206 may be aligned to a solder mask layer 244 formed on the bottom surface 232 of the cavity package substrate 218 or the bottom surface 232 of the package substrate 218 if no solder mask layer 244 is formed. Alternatively, the cavity 220 may be formed in a portion of the cavity package substrate 218. A plurality of conductive planes 222, 226, 227, 252, 254, 256, 258 and 260 may be formed on the top surface 228 of the package substrate 218. A plurality of via plugs 224 may be drilled through the package substrate 218, electrically coupled to the conductive planes 222, 226, 227, 252, 254, 256, 258 and 260. As shown in FIG. 1b, a plurality of ball pads 229 on a bottom surface 232 of the cavity package substrate 218, is electrically coupled to the via plugs 224. In one embodiment of the invention, each of conductive planes 226, 227 and 252 may be electrically coupled to the corresponding ball pad 229 optionally formed on the bottom surface 232 of the package substrate 218 through via plugs 224 drilled through the cavity package substrate 218, respectively. As shown in FIG. 1b, the semiconductor chip package 500a may further comprise the solder mask layer 244 formed on the bottom surface 232 of the cavity package substrate 218 for isolation. Also, the semiconductor chip package 500a may further comprise solder (not shown) formed on the ball pads 229 and 246 to provide interconnection to an underlying printed circuit board (PCB) (not shown) of a final product.

As shown in FIGS. 1a and 1b, bonding wires 212 include bonding wires 212a and 212b, and at least one of the bonding pads 210 may be electrically coupled to conductive planes 222, 252 and 256 on the cavity package substrate 218 by bonding wires 212a, respectively. And the remaining bonding pads 210 may be electrically coupled to the leads 204 by bonding wires 212b, respectively. A covering material 230 may encapsulate the semiconductor chip 208, an inner portion of lead frame 200 and a portion of the cavity package substrate 218 by such as mold filling, leaving the bottom surface 232 or the bottom solder mask layer 244 of the cavity package substrate 218 exposed from the covering material 230.

As shown in FIGS. 1a and 1b, the cavity package substrate 218 not only provides amount of input/output connections of the semiconductor chip 208, but also serves as a heat sink for the semiconductor chip 208. In one embodiment of the invention, the cavity package substrate 218 may provide ground paths for the semiconductor chip 208, such as, ground paths for digital circuits. Also, the via plugs 224 in the cavity package substrate 218 may be used to reduce thermal resistance. Also, a plurality of conductive planes 222, 226, 227, 252, 254, 256, 258 and 260 may be disposed on the top surface 228 of the cavity package substrate 218, electrically connecting to at least one of bonding pads 210 of the semiconductor chip 208 as shown in FIG. 1a, respectively. In one embodiment of the invention, some of the conductive planes 222, 226, 227, 252, 254, 256, 258 and 260 may provide multiple power and/or ground paths for the semiconductor chip 208, such as, power and/or ground paths for analog circuits. Additionally, the lead frame 200 as shown in FIG. 1a and FIG. 2 further comprises a ground bar 234 above and surrounding the chip carrier 206, connecting to the chip carrier 206. The ground bar 234 may be electrically coupled to the conductive planes serving as ground planes on the cavity package substrate 218 through a conductive epoxy (not shown) disposed between the ground bar 234 and the ground planes.

Further, a plurality of electrical components 262 and 264 may be disposed on the cavity package substrate 218, electrically connecting to the bonding pads 210 through the bonding wires 212b as shown in FIG. 1a. The aforementioned electrical components 262 and 264 may comprise passive components comprising power rings, ground rings, capacitors, resistors or inductors. For example, the electrical component 264, may serve as a spiral inductor trace, and be disposed on the bottom surface 232 of the cavity package substrate 218, electrically connecting the bonding pads 210 through the vias 265 and bonding wires 212b as shown in FIG. 1a. As the inductor 264 normally cannot be seen from a top view, the inductor 264 is profiled by dashed lines in FIG. 1a. Additionally, electrical component 262, may serve as a de-coupling capacitor used to reduce noise generated by circuits, and may be disposed on the top surface 228 of the cavity package substrate 218. Compared with a conventional lead frame based semiconductor package, the cavity package substrate 218 may provide additional electrical connections for the semiconductor chip 208, for example, power and/or ground paths. Also, the package substrate 218 and/or the chip carrier 206 may serve as a heat sink and have a cavity to accommodate the semiconductor chip 208. Therefore, the semiconductor chip package 500a may have better thermal dissipation efficiency than the conventional lead frame based semiconductor package. The cavity package substrate 218 may also provide an area for electrical components, for example, power rings, ground rings, capacitors, resistors or inductors, to be disposed thereon. Some electrical performances, for example, power circuit inductance or ground circuit inductance, can be improved. Compared with the conventional ball grid array semiconductor package, the cavity package substrate 218 may have simple layout, for example, large power and ground planes without fine pitch traces. Therefore, fabricating cost can be reduced and yield can be improved.

Figure 3A:
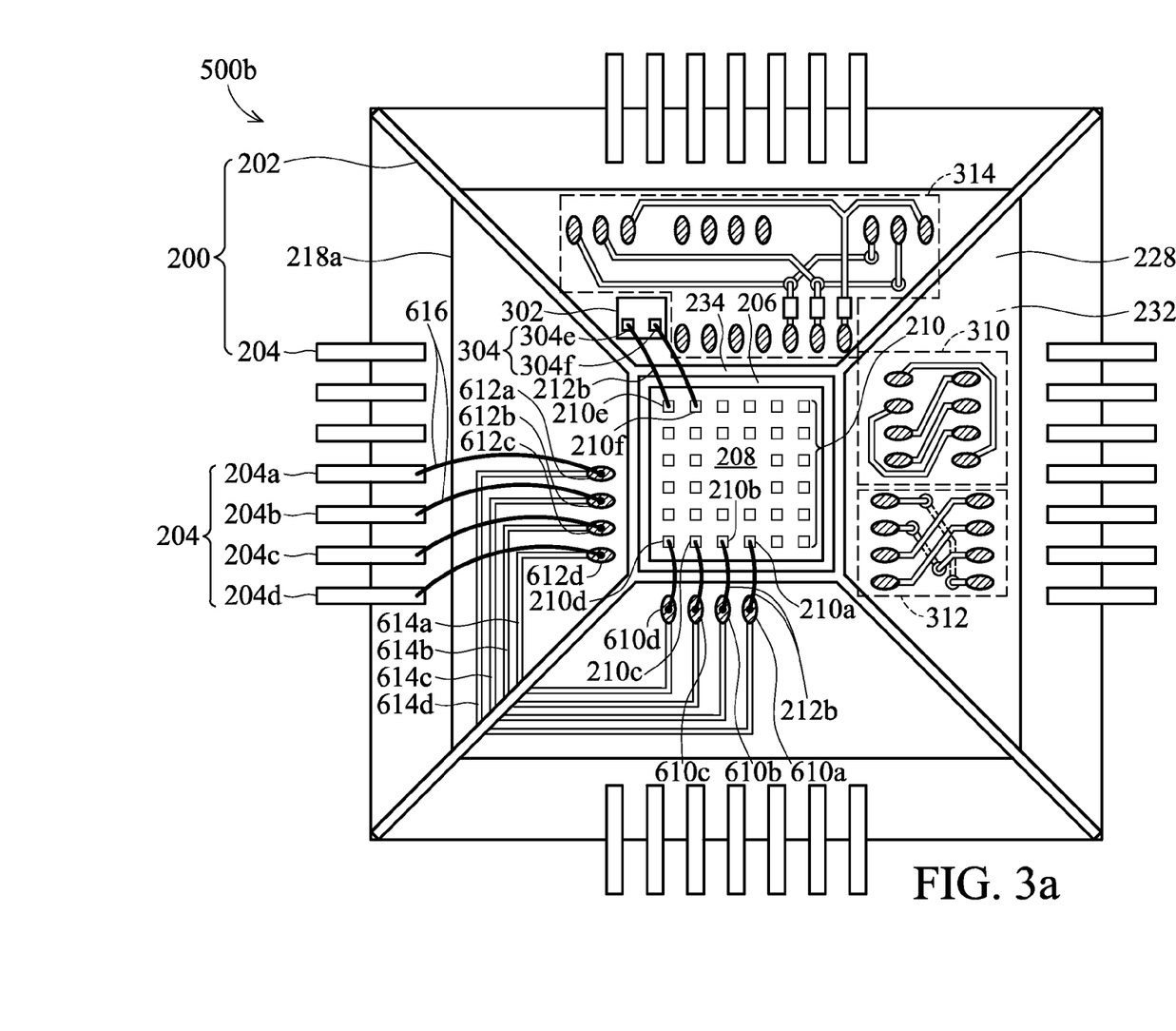
FIG. 3a shows a top view of another exemplary embodiment of a semiconductor chip package of the invention showing a package substrate design.
Figure 3B:
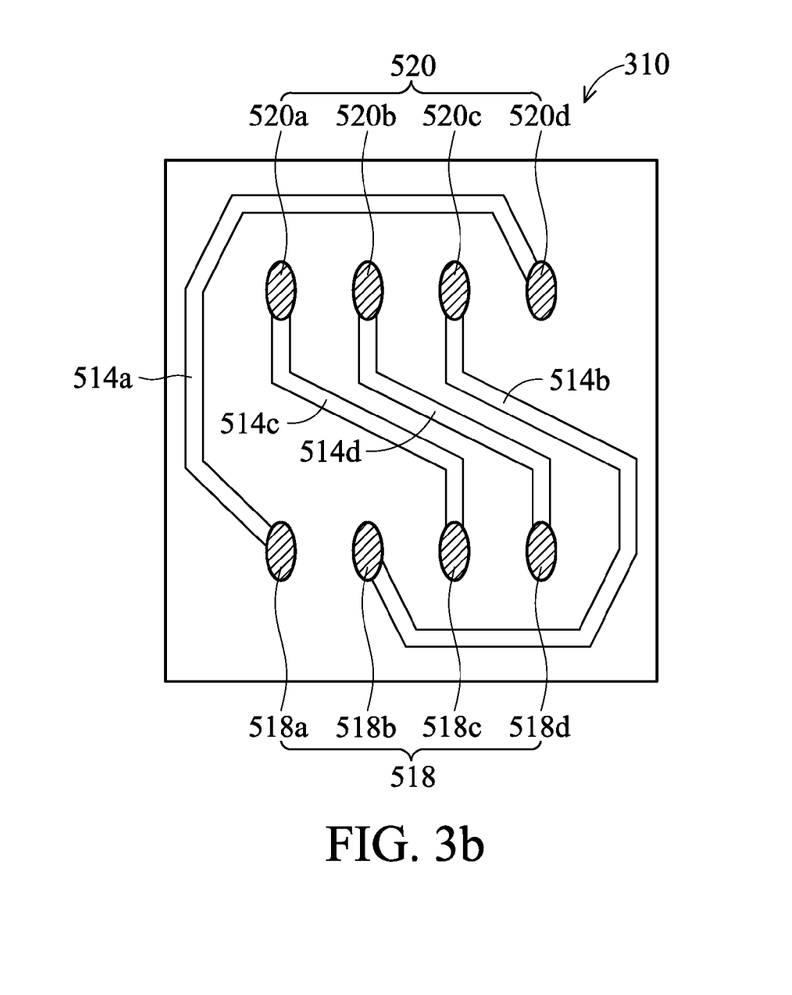

For the conventional lead frame based semiconductor package, the pin assignment allowed for each lead in a design rule is fixed. However, the lead frame based semiconductor chip package according to the present invention, which combines a package substrate with desirable signal trace routing designs of the invention, may achieve signal swapping without using a costly ball grid array semiconductor package. FIG. 3a shows a top view of another exemplary embodiment of a semiconductor chip package 500b of the invention showing the design of the cavity package substrate 218a. In one embodiment, a plurality of fingers and corresponding conductive traces may be disposed on the top surface 228 of the cavity package substrate 218a. The fingers and the corresponding conductive traces may provide desirable signal trace routing between the bonding pads and the leads. FIG. 3b is an enlarged view of a portion 310 of FIG. 3a. As shown in FIG. 3a and FIG. 3b, in one embodiment, the cavity package substrate 218a may comprise a plurality of fingers 518 and 520 on the top surface 228 of the cavity package substrate 218a for signal swapping. The fingers 518 and 520 may be arranged in an array with two rows, comprising inner fingers 518a to 518d and outer fingers 520a to 520d, wherein the inner fingers 518a to 518d are arranged along one row adjacent to the bonding pads 210 of the semiconductor chip 208, and the outer fingers 520a to 520d are arranged along another row adjacent to an edge of the cavity package substrate 218a. In one embodiment, the inner fingers 518a to 518d are used to electrically connect to the bonding pads 210 of the semiconductor chip 208, and the outer fingers 520a to 520d are be used to electrically connect to the leads 204. For signal swapping between the bonding pad adjacent to the inner finger 518a and the lead adjacent to the outer finger 520d, a conductive trace 514a is disposed on the top surface 228 of the cavity package substrate 218a, electrically coupled to the inner finger 518a and outer finger 520d, wherein a routing direction of the conductive trace 514a is substantially along an outer edge of the array. Therefore, the conductive trace 514a may not cross the conductive trace 514c/514d, which is electrically coupled between the inner finger 518c/518d and the outer finger 520a/520b respectively. Similarly, the conductive trace 514b, which is electrically coupled to the inner finger 518b and outer finger 520c, with a routing direction substantially along an outer edge of the array may not cross the conductive trace 514c/514d electrically coupled between the inner finger 518c/518d and the outer finger 520a/520b respectively.

Figure 3C:
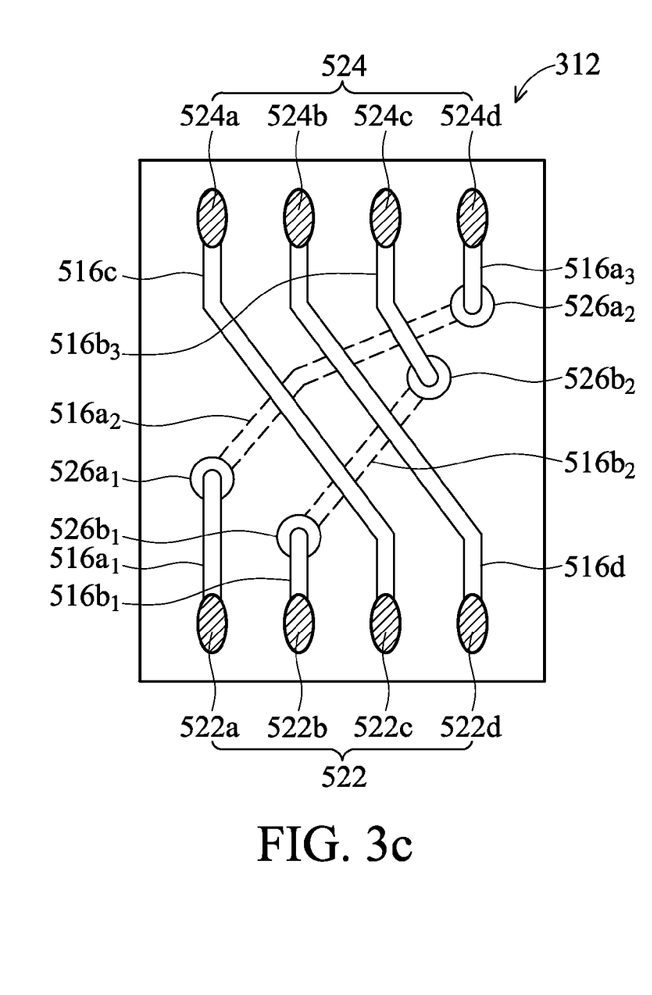

Alternatively, signal swapping may be achieved by a package substrate with conductive traces on the bottom surface 232 of the package substrate. FIG. 3c is an enlarged view of a portion 312 of FIG. 3a. As shown in FIG. 3a and FIG. 3c, in one embodiment, the cavity package substrate 218a may comprise a plurality of fingers 522 and 524 on the top surface 228 of the cavity package substrate 218a for signal swapping. The fingers 522 and 524 are arranged in an array with two rows, comprising inner fingers 522a to 522d and outer fingers 524a to 524d respectively, wherein the inner fingers 522a to 522d are arranged along one row adjacent to the bonding pads 210 of the semiconductor chip 208, and the outer fingers 524a to 524d are arranged along another row adjacent to an edge of the cavity package substrate 218a. In one embodiment, the inner fingers 522a to 522d are used to electrically connect to the bonding pads 210 of the semiconductor chip 208, and the outer fingers 524a to 524d are used to electrically connect to the leads 204. For signal swapping between the bonding pad adjacent to the inner finger 522a and the lead adjacent to the outer finger 524d, a conductive trace $516a_2$ may be disposed on the bottom surface 232 of the cavity package substrate 218a. The conductive trace $516a_2$ is electrically coupled to the inner finger 522a through a via plug $526a_1$ drilled through the cavity package substrate 218a and the conductive trace $516a_1$ on the top surface 228 Also, the conductive trace $516a_2$ may be electrically coupled to the outer finger 524d through a via plug $526a_2$ drilled through the cavity package substrate 218a and the conductive trace $516a_3$ on the top surface 228 Therefore, the conductive trace $516a_2$ may not cross the conductive traces 516c/516d, which are electrically coupled between the inner finger 522c/522d and the outer finger 524a/524b respectively. Similarly, the conductive trace $516b_2$, which is disposed on the bottom surface 232 of the cavity package substrate 218a and electrically coupled to the inner finger 522b and the outer finger 524c through via plugs $526b_1$ and $526b_2$, and conductive traces $516b_1$ and $516b_3$, may not cross the conductive trace 516c/516d electrically coupled between the inner finger 522c/522d and the outer finger 524a/524b.

Figure 3D:
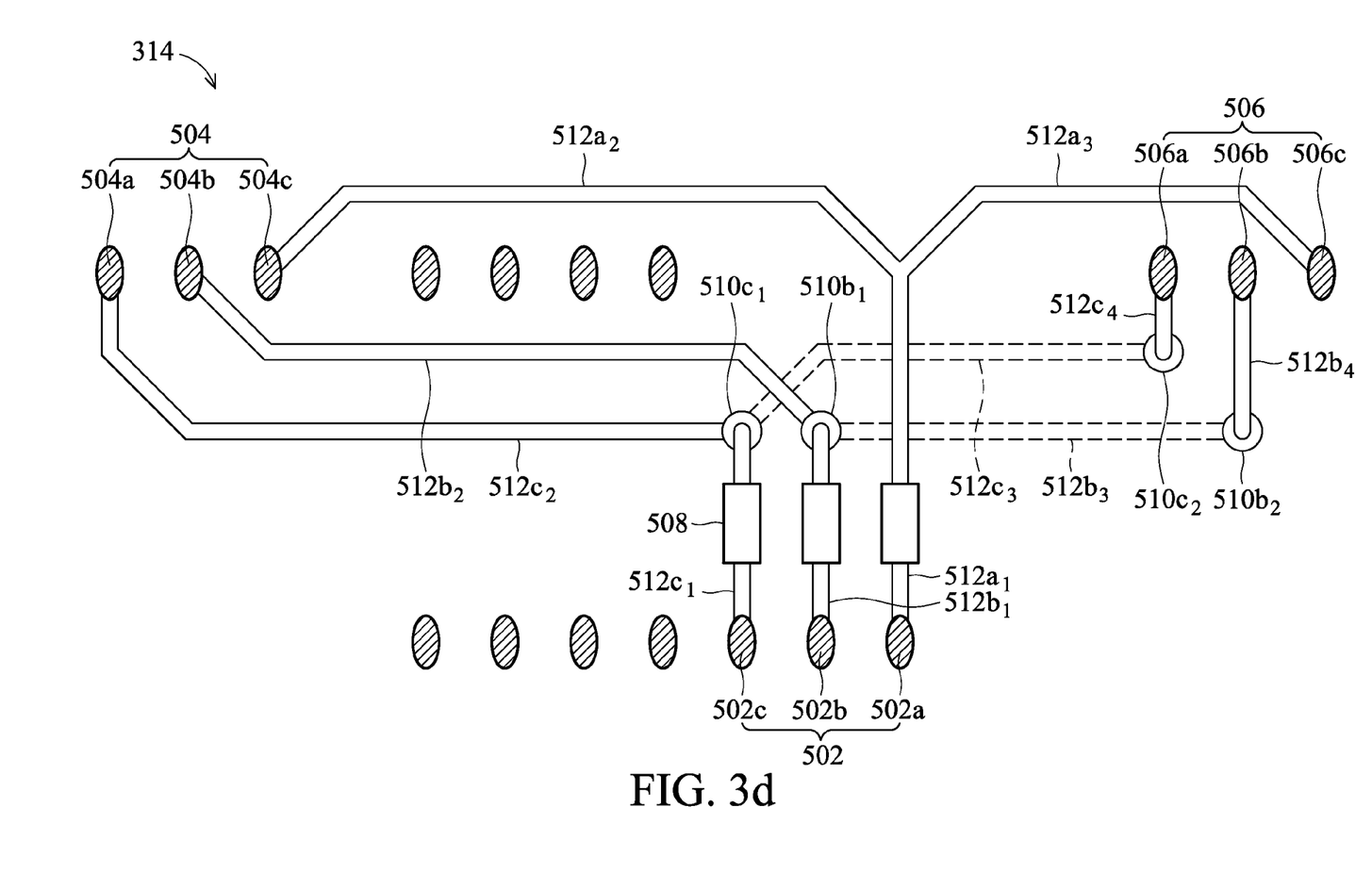

Alternatively, signal dividing from one bonding pad into isolated leads may be achieved by a package substrate having conductive traces with branches of the invention. FIG. 3d is an enlarged view of a portion 314 of FIG. 3a. As shown in FIG. 3a and FIG. 3d, in one embodiment, the cavity package substrate 218a may comprise a plurality of fingers 502, 504 and 506. The fingers 502 are disposed adjacent to the bonding pads 210 of the semiconductor chip 208. The fingers 504 and 506 are disposed adjacent to an edge of the cavity package substrate 218a. For signal dividing from the bonding pad adjacent to the finger 502a into two isolated leads adjacent to the fingers 504c and 506c, a conductive trace $512a_1$ having two branches $512a_2$ and $512a_3$ may be disposed on the top surface 228 of the cavity package substrate 218a, electrically coupled to the finger 502a, wherein the two branches $512a_2$ and $512a_3$ are respectively electrically coupled to the fingers 504c and 506c, thereby allowing the finger 502a to be electrically coupled to the fingers 504c and 506c at the same time. A resistor 508 provided as a damping element may be coupled to the conductive trace $512a_1$. Alternatively, the branches of the conductive trace may not be coplanar. As shown in FIG. 3d, for signal dividing from the bonding pad adjacent to the finger 502b into two isolated leads adjacent to the fingers 504b and 506b, a conductive trace $512b_1$ having two branches $512b_2$ and $512b_3$ may be electrically coupled to the fingers 502b, 504b and 506b at the same time, wherein the two branches $512b_2$ and $512b_3$ are respectively on the top surface 228 and the bottom surface 232 The branch $512b_3$ is electrically coupled to the branch $512b_2$ through a via plug $510b_1$ drilled through the cavity package substrate 218a. Also, the branch $512b_3$ is electrically coupled to the finger 506b through a via plug $510b_2$ and a conductive trace $512b_4$, which is on the top surface 228. Similarly, a conductive trace $512c_1$, having branches $512C_2$ and $512c_3$, may provide a signal dividing path from the bonding pad adjacent to the finger 502c into the leads adjacent to the fingers 504a and 506a, wherein the branch $512c_3$ is electrically coupled to the branch $512c_2$ and the finger 506a on the top surface 228 by via plugs $510c_1$, $510c_2$ and another conductive trace $512c_4$.

Figure 3E:
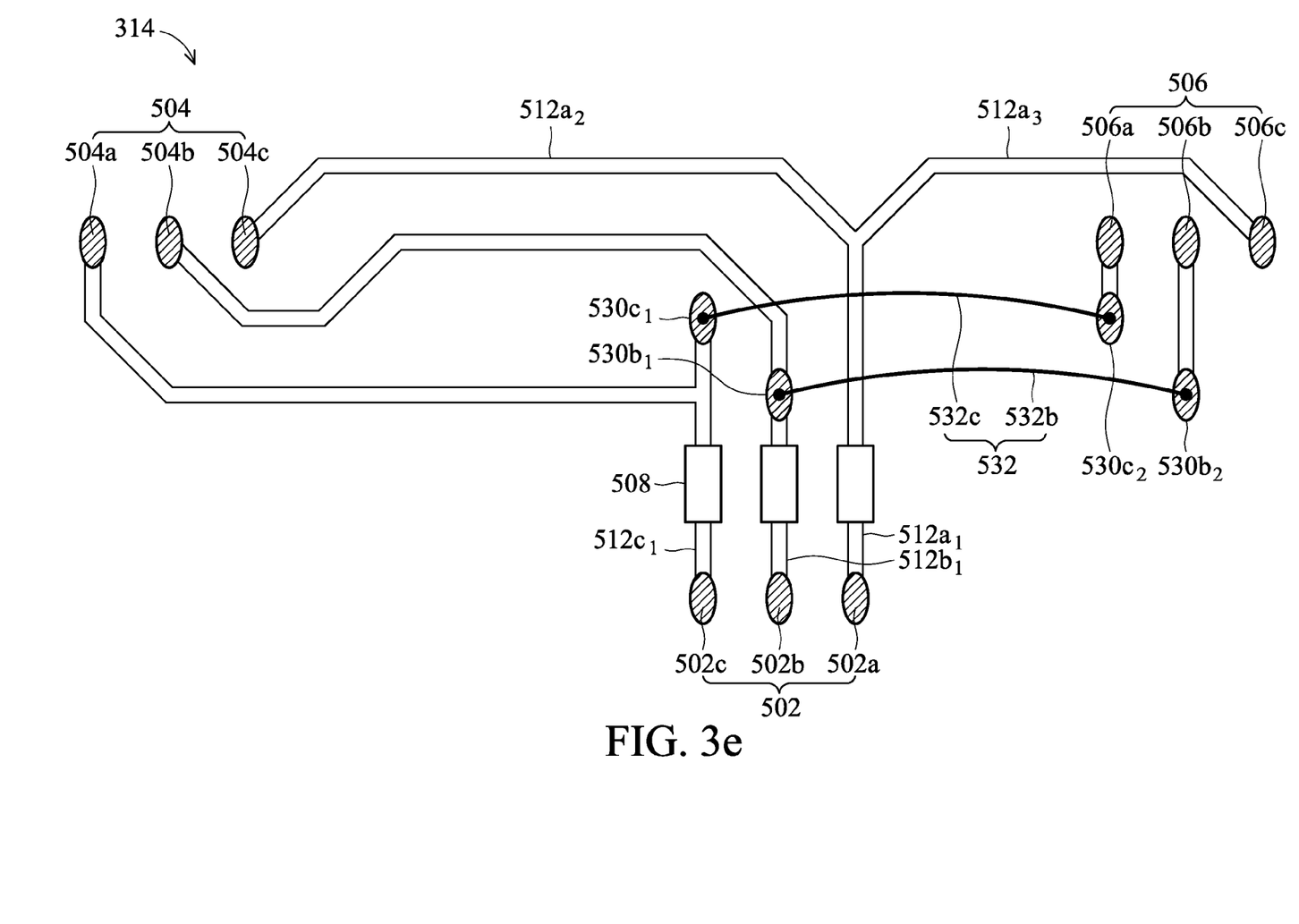

Moreover, signal dividing from one binding pad into isolated leads may also be achieved by a package substrate having conductive traces and switching bonding wires of the invention. FIG. 3e is an enlarged view of a portion 314 of FIG. 3a showing a package substrate design with switching bonding wires 532. As shown in FIG. 3a and FIG. 3e, in one embodiment, the conductive trace $512b_1$ and a switching bonding wire 532b may provide a signal dividing path from the bonding pad adjacent to the finger 502b into the leads adjacent to the fingers 504b and 506b. The switching bonding wire 532b is respectively electrically coupled to the conductive trace $512b_1$ and finger 506b through the connecting fingers $530b_1$ and $530b_2$. Similarly, the conductive trace $512c_1$ and a switching bonding wire 532c may provide a signal dividing path from the bonding pad adjacent to the finger 502c into the leads adjacent to the fingers 504a and 506a. The switching bonding wire 532c is respectively electrically coupled to the conductive trace 512 $c_1$ and finger 506a through the connecting fingers $530c_1$ and $530c_2$. As shown in FIG. 3e, the switching bonding wire 532b is across the conductive trace $512a_1$ on the top surface 228 without electrically connecting to the conductive trace $512a_1$. Also, the switching bonding wire 532c is across the conductive traces $512a_1$ and $512b_1$ on the top surface 228 without electrically connecting to the conductive traces $512a_1$ and $512b_1$.

Figure 3F:
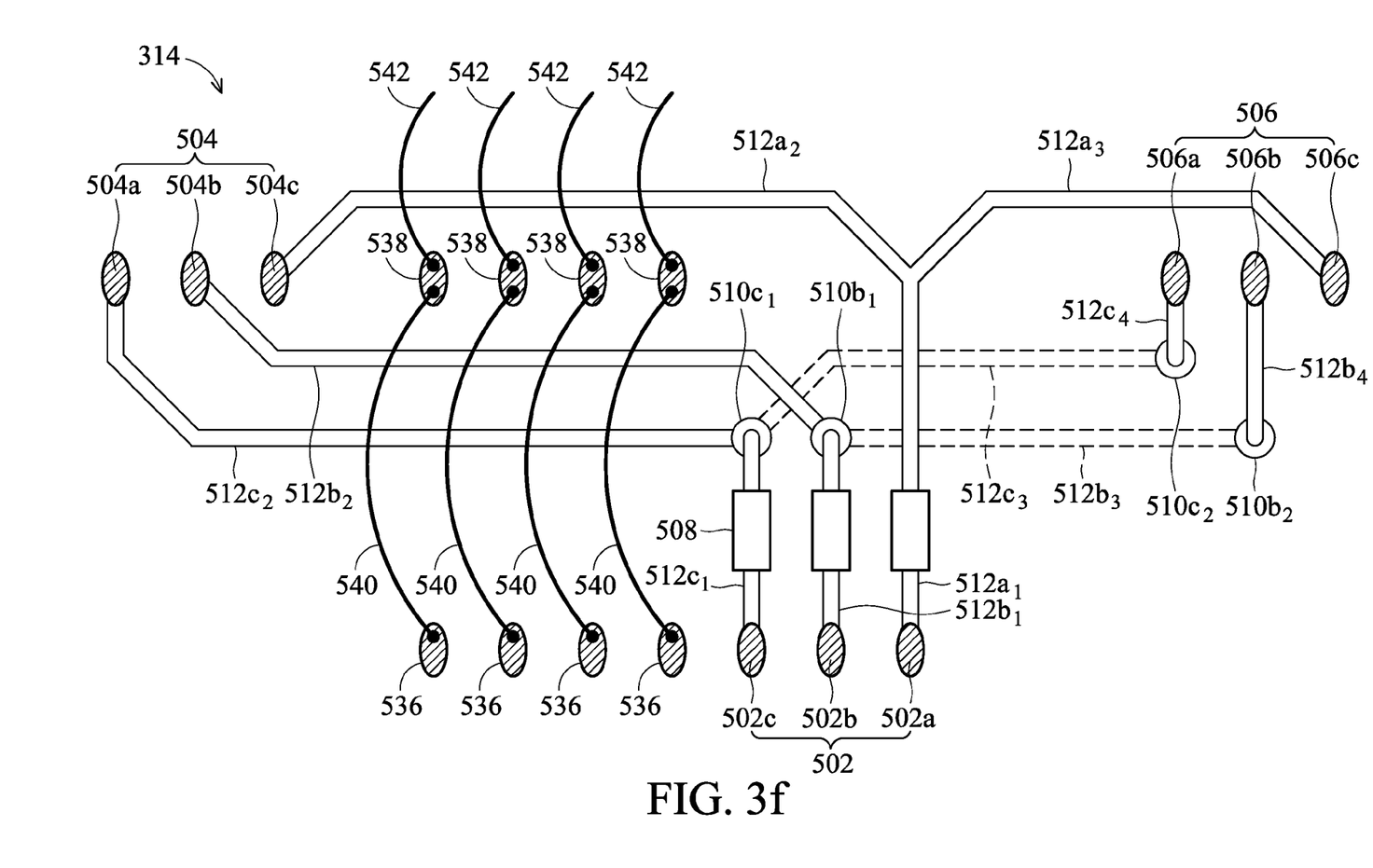

For the conventional lead frame based semiconductor chip package, as the semiconductor chip is scaled down in size, a bonding problem due to bonding wire length limitations occurs. The aforementioned problem can be solved with a fine pitch lead frame to reduce a bonding distance between the bonding pads and the leads. The fine pitch lead frame, however, results in high fabrication cost and low yield. FIG. 3f is an enlarged view of a portion 314 of FIG. 3a showing a package substrate design to solve the bonding wire length limitation problem. As shown in FIG. 3a and FIG. 3f, fingers 536 and 538 are arranged in a two-row array on the top surface 228 of the cavity package substrate 218a, wherein the fingers 536 are disposed adjacent to the semiconductor chip 208, and the fingers 538 are disposed adjacent to an edge of the cavity package substrate 218a. The fingers 536 may be electrically coupled to the bonding pads (not shown), the bonding wires 540 may be disposed and electrically connecting between the fingers 536 and 538, and the bonding wires 542 electrically connecting to the fingers 538 may be used to connect the leads. The bonding distance between the bonding pads and the leads may be reduced by multiple wirebondings provided by the cavity package substrate 218a comprising fingers 536 and 538 and the bonding wires 540 and 542.

Signal routing from the bonding pad to the lead, which are respectively adjacent to different sides of the semiconductor chip, may be achieved by a package substrate with fingers and conductive traces of the invention. As shown in FIG. 3a, fingers 610a to 610d and 612a to 612d are disposed on the top surface 228 of the cavity package substrate 218a. The fingers 610a to 610d respectively adjacent to the bonding pads 210a to 210d are electrically coupled to the bonding pads 210a to 210d through the bonding wires 212b. The fingers 612a to 612d respectively adjacent to the leads 204a to 204d are electrically coupled to the leads 204a to 204d through the bonding wires 616. A plurality of conductive traces 614a to 614d may be disposed on the top surface 228 wherein the conductive traces 614a to 614d may be electrically coupled between the fingers 610a to 610d and the fingers 612a to 612d, respectively. Therefore, the signal from the bonding pad may be transmitted to the lead, which is on a different side from the bonding pad, through the conductive trace on the package substrate. For example, the signal from the bonding pad 210a may be transmitted to the lead 204a, which is on a different side from the bonding pad 210a, through the conductive trace 614d and corresponding fingers 610a and 612a.

Additionally, other semiconductor chips, for example, electrically erasable programmable read-only memory chips (EEPROM) 302 with bonding pads 304 (bonding pads 304 include bonding pads 304e and 304f) thereon may be disposed on the cavity package substrate 218a, which electrically coupled to the semiconductor chip 208 through the bonding wires, for example, bonding wires 212b.

Figure 4:
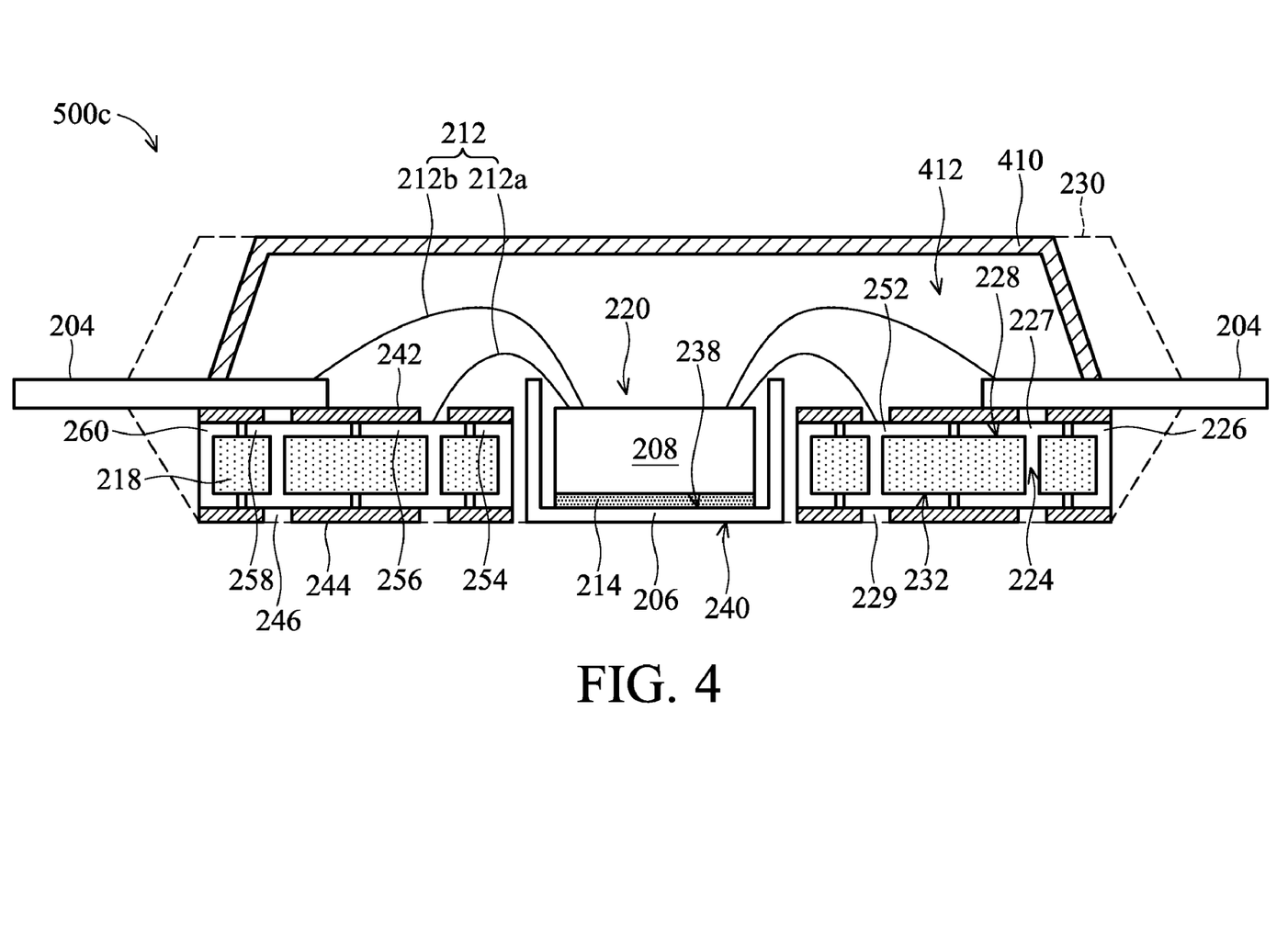
FIG. 4 shows a cross section of another exemplary embodiment of a semiconductor chip package of the invention.

FIG. 4 is another exemplary embodiment of a semiconductor chip package 500c of the invention showing a semiconductor chip package with a heat sink. As shown in FIG. 4, for heat dissipation efficiency improvement, a heat sink 410 may be mounted on the top surface 228 of the cavity package substrate 218, having a cavity 412 to accommodate the semiconductor chip 208, an inner portion of the lead frame 200 and a portion of the package substrate 218 therein.

Figure 5A:
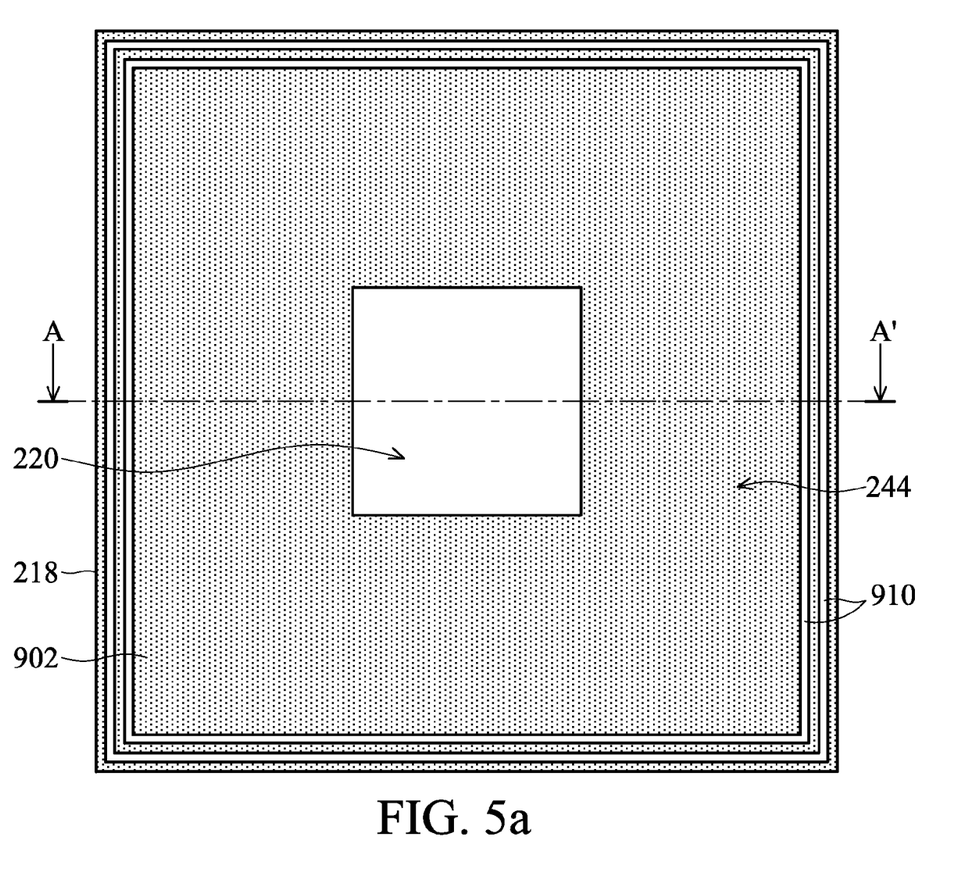
FIG. 5a shows a bottom view of one exemplary embodiment of a substrate of a semiconductor chip package of the invention.
Figure 5B:
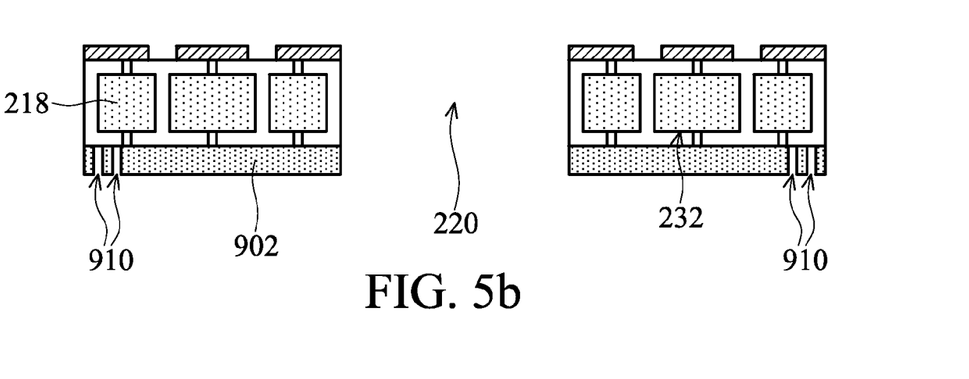

FIG. 5a and FIG. 5b show one exemplary embodiment of a package substrate 218 of a semiconductor chip package according to the invention. The cavity package substrate 218 may further comprise a solder mask layer 902 on the bottom surface 232 of the cavity package substrate 218, wherein the solder mask layer 902 may comprise grooves 910 substantially along an edge of the package substrate 218 or the edge of the cavity 220 (not shown), thereby preventing bleeding out of a mold resin used for encapsulating the semiconductor chip package.

The semiconductor chip packages 500a to 500c are illustrated. Some advantages of an exemplary embodiment of the semiconductor chip packages 500a to 500c of the invention are described in the following. The cavity package substrates 218 or 218a not only serves as a heat sink for the semiconductor chip 208, but also provides an increased amount of input/output connections for the semiconductor chip 208. Also, the package substrate 218 may serve as a heat sink and have a cavity to accommodate the semiconductor chip 208. Therefore, the semiconductor chip packages 500a to 500c may have better thermal dissipation efficiency than the conventional lead frame based semiconductor package. Compared with the conventional lead frame based semiconductor package, the cavity package substrates 218 or 218a may provide additional electrical connections for the semiconductor chip 208, for example, power and/or ground paths. The cavity package substrates 218 or 218a may also provide an area for electrical components, for example, power rings, ground rings, capacitors, resistors or inductors, to be disposed thereon. Some electrical performances, for example, power circuit inductance or ground circuit inductance, can be improved. Compared with the conventional ball grid array semiconductor package, package substrate 218 may have simple layout. Therefore, fabricating cost can be reduced and yield can be improved. The via plugs 224 may be used for reducing thermal resistance. Additionally, the package substrate of the semiconductor chip package 500 may have fingers, conductive traces or switching bonding wires thereon to provide additional signal routing paths for signal swapping and signal dividing. The signal traces may directly pass over a solid ground plane without any split because no power translation path occupies the ground plane directly below signal traces. The aforementioned additional signal routing paths may improve electrical performances of a two-layered printed circuit board, for example, good signal quality and less EMI effect, in the high signal frequency region without a costly multi-layered printed circuit board. Also, the bonding distance between the bonding pads and the leads may be reduced by multiple wirebondings provided by the package substrate comprising fingers and the bonding wires, thereby reducing fabrication costs. Moreover, to improve heat dissipation efficiency, the semiconductor chip packages may further comprise a heat sink mounted on the top surface of the package substrate, having a cavity to accommodate the semiconductor chip, an inner portion of the lead frame and a portion of the package substrate therein. Also, the package substrate may further comprise a solder mask layer comprising grooves substantially along an edge of the package substrate or the cavity, thereby preventing bleeding of a mold resin used for encapsulating the semiconductor chip package.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor chip package, comprising:
a lead frame having a chip carrier;
a semiconductor chip mounted on the chip carrier, having a plurality of bonding pads thereon;
a package substrate having a cavity therein to accommodate the chip carrier and the semiconductor chip, wherein at least one of the bonding pads of the semiconductor chip is electrically coupled to the package substrate wherein the package substrate having a top surface adjacent to the bonding pads and an opposite bottom surface; and wherein the package substrate comprises a plurality of fingers on the top surface thereof, which are arranged in an array with a row of inner fingers adjacent to the semiconductor chip and a row of outer fingers adjacent to an edge of the package substrate, wherein the inner fingers are electrically coupled to the bonding pads of the semiconductor chip, and the outer fingers are electrically coupled to the lead frame.

2. The semiconductor chip package as claimed in claim 1, wherein the cavity is formed through the package substrate.

3. The semiconductor chip package as claimed in claim 1, wherein the cavity is formed in a portion of the package substrate.

4. The semiconductor chip package as claimed in claim 1, wherein the lead frame comprises a plurality of leads, and at least one of the leads is electrically coupled to at least one of the bonding pads.

5. The semiconductor chip package as claimed in claim 1, further comprising:
at least one conductive plane on the top surface of the package substrate, electrically coupled to at least one of the bonding pads of the semiconductor chip;
at least one via drilled through the package substrate, wherein the at least one via is electrically coupled to the conductive plane; and
at least one electrical component on the package substrate, electrically coupled to at least one of the bonding pads.

6. The semiconductor chip package as claimed in claim 1, wherein the at least one conductive plane comprises a power plane or a ground plane.

7. The semiconductor chip package as claimed in claim 6, wherein the lead frame further comprises a ground bar above and surrounding the chip carrier, electrically coupled to the ground plane.

8. The semiconductor chip package as claimed in claim 1, wherein the at least one electrical component comprises a power ring, a ground ring, an inductor trace, a capacitor, a resistor, a diode or an inductor.

9. The semiconductor chip package as claimed in claim 1, further comprising:
a covering material encapsulating the semiconductor chip, an inner portion of the lead frame and a portion of the package substrate, leaving the bottom surface of the package substrate exposed from the covering material.

10. The semiconductor chip package as claimed in claim 1, further comprising:
a first conductive trace on the top surface of the package substrate, electrically coupled to at least one of the inner fingers and at least one of the outer fingers; and
a second conductive trace on the top surface of the package substrate, wherein the second conductive trace is electrically coupled to at least another one of the inner fingers and at least another one of the outer fingers without crossing the first conductive trace.

11. The semiconductor chip package as claimed in claim 1, further comprising:
a first conductive trace on the top surface of the package substrate, electrically coupled to at least one of the inner fingers and at least one of the outer fingers; and
a second conductive trace on the bottom surface of the package substrate, electrically coupled to at least another one of the inner fingers and at least another one of the outer fingers through at least one via plug drilled through the package substrate.

12. The semiconductor chip package as claimed in claim 1, further comprising:
a conductive trace having a first branch and a second branch on the top surface of the package substrate, electrically coupled to one of the inner fingers, wherein the first and the second branches are respectively electrically coupled to at least two of the outer fingers.

13. The semiconductor chip package as claimed in claim 12, wherein the first branch is on the top surface of the package substrate, the second branch is on the bottom surface, and the second branch is electrically coupled to the first branch and one of the at least two outer fingers through at least one via plug drilled through the package substrate.

14. The semiconductor chip package as claimed in claim 1, further comprising:
a first conductive trace on the top surface of the package substrate, electrically coupled to at least one of the inner fingers and at least one of the outer fingers;
a first connecting finger and a second connecting finger on the top surface of the package substrate, respectively electrically coupled to the first conductive trace and another one of the outer fingers; and
a bonding wire electrically coupled between the first connecting finger and the second connecting finger.

15. The semiconductor chip package as claimed in claim 14, wherein the bonding wire is across a second conductive trace on the top surface of the package substrate without electrically connecting to the second conductive trace.

16. The semiconductor chip package as claimed in claim 1, further comprising:
a bonding wire electrically coupled to at least one of the inner fingers and at least one of the outer fingers.

17. The semiconductor chip package as claimed in claim 16, wherein the bonding wire is across a conductive trace on the top surface of the package substrate without electrically connecting to the conductive trace.

18. The semiconductor chip package as claimed in claim 1, further comprising:
a heat sink mounted on or over the top surface of the package substrate, having a cavity to accommodate the first semiconductor chip, an inner portion of the lead frame and a portion of the package substrate therein.

19. The semiconductor chip package as claimed in claim 1, further comprising a solder mask layer on the bottom surface of the package substrate, wherein the solder mask layer comprises a groove substantially along an edge of the package substrate or the cavity.

20. The semiconductor chip package as claimed in claim 1, wherein the bottom surface of chip carrier is exposed and coplanar with the bottom surface of the package substrate.

21. A semiconductor chip package, comprising:
- a lead frame having a chip carrier and leads in different levels;
- a semiconductor chip mounted on the chip carrier, having a plurality of bonding pads thereon;
- a package substrate having a bottom surface substantially align to the chip carrier, wherein at least one of the bonding pads is electrically coupled to the package substrate, and the remaining bonding pads are electrically coupled to the leads, respectively wherein the package substrate comprises a plurality of fingers on the top surface thereof, which are arranged in an array with a row of inner fingers adjacent to the semiconductor chip and a row of outer fingers adjacent to an edge of the package substrate, wherein the inner fingers are electrically coupled to the bonding pads of the semiconductor chip, and the outer fingers are electrically coupled to the lead frame.

22. The semiconductor chip package as claimed in claim 21, wherein the package substrate has a cavity therein to accommodate the chip carrier and the semiconductor chip.

* * * * *